Dec. 28, 1965 W. F. PALMER 3,226,609

HIGH CONDUCTION SEMICONDUCTOR DIODE

Filed Oct. 25, 1960

INVENTOR.
WILLIAM F. PALMER
BY David M. Keay
AGENT.

United States Patent Office 3,226,609

Patented Dec. 28, 1965

3,226,609

HIGH CONDUCTION SEMICONDUCTOR DIODE

William F. Palmer, Carlisle, Mass., assignor to Sylvania Electric Products Inc., a corporation of Delaware Filed Oct. 25, 1960, Ser. No. 64,770
9 Claims. (Cl. 317—234)

Figures 1, 2, 3:
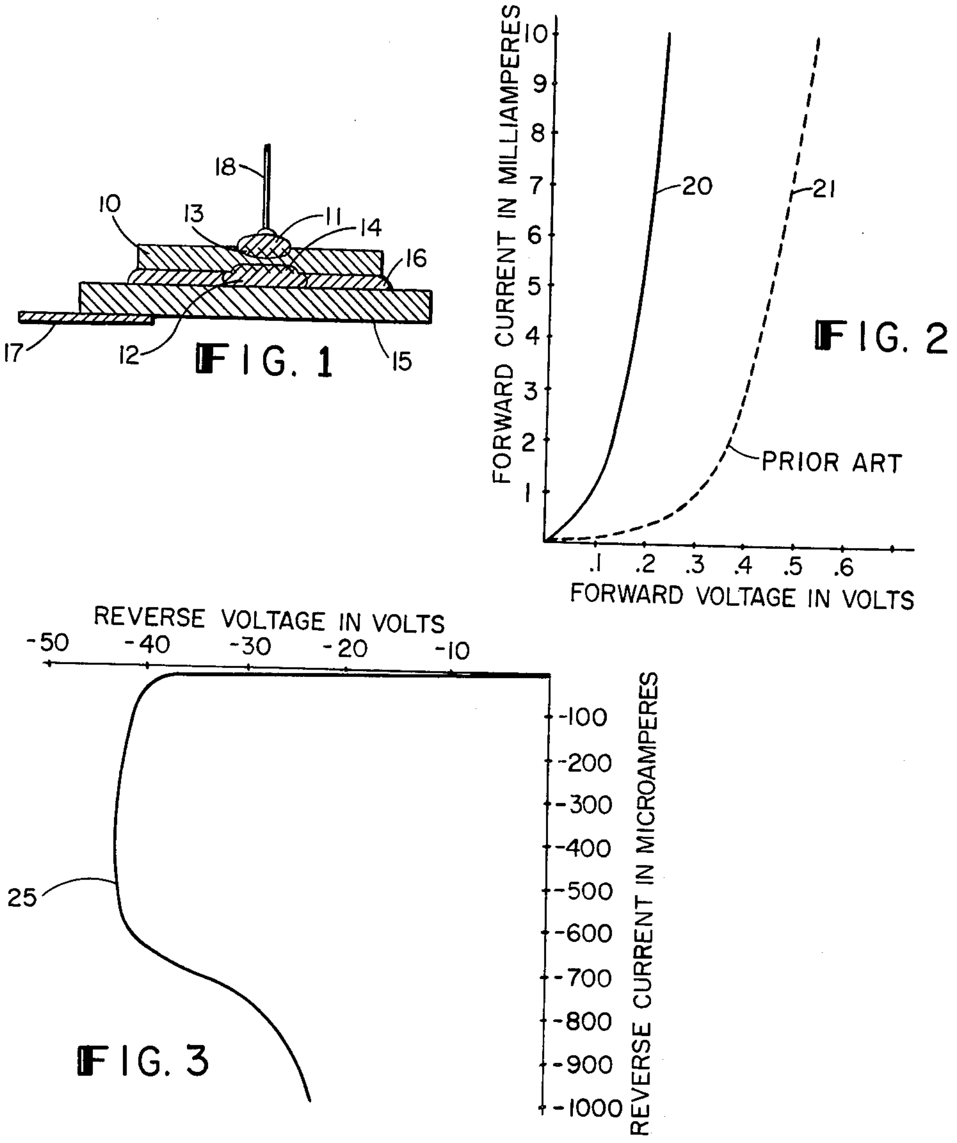

This invention relates to electrical translating devices, and more particularly to semiconductor diodes.

Semiconductor diodes are employed in countless applications as rectifiers and detectors because of their small size and low power requirements. An ideal rectifier or detector would offer no resistance to the flow of electrical current when voltage is applied in the forward or conducting direction, and would offer infinite resistance to the flow of current when voltage is applied in the reverse or nonconducting direction. Existing semiconductor diodes do not possess these ideal conduction characteristics. Many different types of diodes have been developed to obtain conduction characteristics which will more closely approach this ideal over particular portions of the operating range of a device. However, the improvements to be gained in the conduction characteristic over one portion of the operating range of a device must generally be balanced against electrical deterioration of other electrical characteristics. Thus, there is no one "universal" type of semiconductor diode. Many factors including forward conduction, reverse conduction, recovery time, reverse breakdown voltage, and power dissipation capabilities must be considered in choosing the proper semiconductor diode for a particular application.

In many applications in which semiconductor diodes are employed as detectors it is particularly important that their forward conduction be very high. Various types of diodes have been developed in order to provide diodes exhibiting what have been considered a reasonably good forward conduction characteristic and a satisfactory ratio between the forward and reverse conduction characteristic. For example, one well known commercially available type of diode is the so-called "gold-bonded" diode. In this device an electrode of gold containing a conductivity type imparting impurity such as gallium is fused to an N-type body of germanium to provide the rectifying junction. The electrical characteristics of this device are such that it is considered a high forward conduction diode having a satisfactory reverse conduction characteristic.

It is an object of the present invention to provide an improved semiconductor diode.

More specifically, it is an object of the present invention to provide a semiconductor diode which exhibits an improved forward conduction characteristic without deterioration of other electrical characteristics.

Briefly, in accordance with the objects of the invention a body of semiconductor material is provided which has a zone of one type of conductivity intermediate two zones of the opposite type of conductivity. A first electrode makes ohmic contact to one of the zones of the opposite type of conductivity, and a second electrode makes ohmic contact to both the other zone of the opposite type of conductivity and to the zone of the one type of conductivity.

Additional objects, features, and advantages of the semiconductor device according to the invention will be apparent from the following detailed discussion and the accompanying drawings wherein:

FIG. 1 is a representation in cross section of a semiconductor diode according to the invention, FIG. 2 is a graph illustrating the forward conduction characteristic of the device of FIG. 1 in comparison with the forward conduction characteristic of a well known type of high conduction diode, and FIG. 3 is a graph illustrating the reverse conduction characteristic of the device of FIG. 1.

A semiconductor diode according to the invention is illustrated in FIG. 1. In the figure certain dimensions are exaggerated in relation to other dimensions in order to present a clearer understanding of the invention. The device shown includes a body 10 of semiconductor material of one type of conductivity, for example P-type, in the form of a small rectangular wafer or die having flat, parallel, opposite major surfaces. A first pellet 11 of a material capable of imparting the opposite type of conductivity to the semiconductor material is alloyed into one surface of the die. A second pellet 12 which is usually slightly larger than the first of a material capable of imparting the opposite type of conductivity to the semiconductor material is alloyed into the opposite major surface of the die, concentric with the first pellet. When the die is of P-type conductivity, the pellets are of material capable of imparting N-type conductivity. In the alloying process a portion of the semiconductor body adjacent the first pellet becomes molten and then recrystallizes containing some of the material of the pellet so as to form a first zone 13 of semiconductor material of N-type conductivity. A second zone 14 of semiconductor material of N-type conductivity is similarly formed when the second pellet is alloyed to the die.

A conductive mounting member in the form of a metal plate or disc 15 having a flat, planar surface is then applied to the semiconductor die. The surface of the die having the second pellet alloyed thereto is bonded against the planar surface of the disc by means of a layer of a solder material 16. The solder material includes an impurity capable of imparting P-type conductivity to the semiconductor material in order to insure that an ohmic contact is obtained between the disc and the P-type zone of the semiconductor die. In the process of attaching the disc to the P-type area on the surface of the semiconductor die, the second pellet 12 which is encircled by the large area contact between the disc and the die is also attached to the disc. Thus the disc and the pellet together with the solder material provide an electrode structure which forms ohmic contact both to the P-type zone of the semiconductor die and to the second recrystallized zone 14 of N-type conductivity. Lead wires 18 and 17 are then soldered to the first pellet 11 and to the disc 15, respectively, to provide terminals for making electrical connections to the device.

One typical device according to the invention is fabricated from a die 10 of single crystal P-type germanium of 2 ohm-centimeters resistivity containing indium as a conductivity imparting material. The die is 1.5 mils thick and 75 mils square. The first pellet 11 is applied to the surface of the die in the shape of a sphere 10 mils in diameter comprised of 99% lead and 1% arsensic, and the second pellet 12 is applied in the shape of a sphere 12 mils in diameter comprised of 90% lead and 10% antimony. The pellets are alloyed into the die simultaneously at a temperature of 780° C. for a period of 6 minutes. The thickness of the P-type zone between the N-type zones 13 and 14 formed by the alloying step is about 0.5 mil. The die is then suitably etched and cleaned in accordance with usual well known processing techniques employed in the fabrication of semiconductor devices. The disc 15 is of Kovar 113 mils in diameter and 6 mils thick. A layer of indium-gold alloy 16 on the surface of the disc serves as a solder for attaching the die and second pellet to the surface of the disc. The disc and die are placed together and heated in a furnace to melt the solder. The second pellet also melts and may spread out during the soldering operation. However, since the disc, solder, and pellet combine to form a conductive electrode structure, deformation of the pellet is of no consequence, and secure electrical and mechanical bonds between the disc and die and the disc and pellet result. Leads 18 and 17 are then soldered to the first pellet and the disc to provide the cathode and anode connections, respectively.

The solid curve 20 of FIG. 2 illustrates graphically the conduction characteristic of a typical device according to the foregoing specific embodiment of the invention when the cathode lead 18 is connected to the negative terminal of a potential source and the anode lead 17 is connected to the positive terminal. The broken curve 21 illustrates the forward conduction characteristic which is typical of that obtained from the gold-bonded type of diode, a well known prior art type of high conduction diode. The improved forward conduction characteristic at low voltages and currents for devices according to the invention is apparent from the curves. The relative advantage also exists at higher currents and voltages than shown on the curves. For example, at a value of 0.5 volt 100 or more milliamperes will flow through a diode according to the invention. In order to obtain this current in a typical gold-bonded diode an applied potential of about 1 volt is required.

Although the reasons for the high forward conduction obtained in devices according to the invention is not fully understood, apparently minority carriers are injected from the first N-type zone into the P-type zone because of the potential difference between the first pellet and the ohmic connection to the P-type zone. The proximity of the second N-type zone and the potential applied to it may cause the majority of the carriers to flow directly across this region of the P-type zone rather than along the longer path of higher resistance to the ohmic connection to the P-type zone. Thus, a very low effective resistance is presented to current flow through the device in the forward direction.

The characteristic curve 25 of a typical diode according to the foregoing specific embodiment of the invention when it is connected with the polarity reversed is shown in FIG. 3. Reverse conduction from zero voltage to the breakdown voltage is similar to that of typical gold-bonded high conduction diodes. That is, in diodes according to the invention high forward conduction is obtained with no deterioration of the reverse characteristic, or, in other words, an improved ratio of forward conduction to reverse conduction is obtained. Additionally, as can be seen from the curve of FIG. 3, the device according to the invention exhibits a sharp breakdown characteristic and also exhibits negative resistance in the breakdown region. The exact characteristics in the negative resistance region depend on the configurations and resistivities of the various zones. The device can thus be utilized in circuitry requiring either a sharp avalanche breakdown or a negative resistance region. These characteristics are not typical of gold-bonded diodes.

Typical devices according to the foregoing specific embodiment of the invention exhibit a recovery time of between 0.25 and 0.5 microsecond when switched from a condition of forward bias producing a current of 20 milliamperes to a reverse bias condition of 20 volts. This time is of the same order of magnitude as the recovery time of known types of gold-bonded diodes. In addition to the improved forward conduction characteristic which is obtained in diodes according to the invention without deterioration of the reverse characteristic or the recovery time, the structure of the area contacts to the semiconductor material enables the diodes to conduct relatively heavy currents which would burn out a gold-bonded diode.

Obviously, various modifications of the semiconductor device described hereinabove are possible without departing from the spirit and scope of the invention. For example, it may be considered desirable to remove the protruding portion of the second pellet before the conductive plate is attached to the surface of the die. In this case the plate will make ohmic contact directly to the portion of the pellet which has been alloyed with the die. Other examples of modifications which might readily be made in the device described are reversal of the conductivity types of the zones of semiconductor material, and the use of a die of a semiconductor material other than germanium such as, for example, silicon.

What is claimed is:

1. A semiconductor device comprising a monocrystalline body of semiconductor material having a first zone of one conductivity type with first and second planar surfaces on opposite sides thereof, second and third zones of the opposite conductivity type disposed in the first zone on each of said sides respectively and forming two spaced PN junctions with the first zone, a first electrode making ohmic contact solely to one of said zones of the opposite conductivity type, and a second electrode making ohmic contact to both said first zone and the other of said zones of the opposite conductivity type.

2. A semiconductor device comprising a thin flat wafer of semiconductor material of one conductivity type, pellets of material capable of imparting the opposite type of conductivity alloyed into opposite surfaces of said wafer, a conductive member making ohmic contact to both one surface of the wafer and the pellet alloyed to that surface, a first terminal means in contact with said conductive member for providing circuit connections thereto, and a second terminal means in contact with the pellet alloyed to the surface opposite said one surface for providing circuit connections thereto.

3. A semiconductor device comprising a thin flat wafer of semiconductor material of one conductivity type having two opposite flat, parallel, major surfaces, a first pellet of a material capable of imparting the opposite type of conductivity alloyed to one of said major surfaces, a second pellet of a material capable of imparting the opposite type of conductivity alloyed to the opposite major surface concentric with the first pellet, a conductive mounting member making ohmic contact to both said one of said major surfaces and said first pellet, a first electrical conductor in contact with said second pellet for providing circuit connections thereto, and a second electrical conductor in contact with said mounting member for providing circuit connections thereto.

4. A semiconductor device comprising a thin flat wafer of semiconductor material of one conductivity type having two opposite flat, parallel, major surfaces, a first pellet of a material capable of imparting the opposite type of conductivity alloyed to one of the major surfaces of the wafer, a second pellet of a material capable of imparting the opposite type of conductivity alloyed to the opposite major surface of the wafer concentric with the first pellet, a conductive mounting member having a flat surface, said one major surface of the wafer making a large area ohmic contact to the surface of the mounting member, the first pellet making ohmic contact to the surface of the mounting member and being encircled by the area contact between the wafer and the mounting member, a first electrical conductor in contact with said second pellet for providing circuit connections thereto, and a second electrical conductor in contact with said mounting member for providing circuit connections thereto.

5. A semiconductor device comprising a thin flat wafer of semiconductor material of one conductivity type having two opposite flat, parallel, major surfaces, a first pellet of a material capable of imparting the opposite type of conductivity alloyed to one of the major surfaces of the wafer, a second pellet of a material capable of imparting the opposite type of conductivity alloyed to the opposite major surface of the wafer concentric with the first pellet, a conductive plate having a flat, planar surface, the first pellet making ohmic contact to one area of said surface of the plate, the portion of the one major surface of the wafer not having the first pellet alloyed thereto making a continuous ohmic area contact to said surface of the plate encircling the contact between the first pellet and said surface of the plate, a first terminal means in contact with said second pellet for providing circuit connections thereto, and a second terminal means in contact with said plate for providing circuit connections thereto.

6. A semiconductor device comprising a thin, flat, wafer of single crystal P-type germanium having two opposite flat, parallel, major surfaces, a first pellet containing an N-type imparting material alloyed to one of the major surfaces of the wafer, a second pellet containing an N-type imparting material alloyed to the opposite major surface of the wafer concentric with the first pellet, a thin, flat, conductive plate having a flat, planar surface, the first pellet making ohmic contact to one area of said surface of the plate, the portion of the one major surface of the wafer not having the first pellet alloyed thereto making a continuous ohmic area contact to said surface of the plate encircling the contact between the first pellet and said surface of the plate, a first lead wire in contact with said second pellet for providing circuit connections thereto, and a second lead wire in contact with said plate for providing circuit connections thereto.

7. A transistor structure comprising a first zone of semiconductor material of one conductivity type with a zone of semiconductor material of the opposite conductivity type thereon, a second zone of semiconductor material of the one conductivity type atop said zone of the opposite conductivity type and separated by a very thin portion of said zone of the opposite conductivity type from said first zone of the one conductivity type, said zone of the opposite conductivity type and said second zone of the one conductivity type forming a common upper surface mainly comprised by said zone of the opposite conductivity type, a pair of ohmic contacts with the first thereof joined to said first zone of the one conductivity type and the second joined to said second zone of the one conductivity type and the zone of the opposite conductivity type at said common upper surface, a first electrical conductor in contact with the first of said ohmic contacts for providing circuit connections thereto, and a second electrical conductor in contact with the second of said ohmic contacts for providing circuit connections thereto.

8. An improved negative resistance transistor diode structure comprising a first zone of semiconducting material, a thin second zone of opposite type semiconducting material from said first zone material joined to the upper surface of same to form a transistor junction therebetween, a minute third zone of semiconducting material of the same type as said first zone material joined to said second zone to form a transistor junction therebetween, said third zone being separated from said first zone by a very thin portion of said second zone and forming a common surface with said second zone, a pair of ohmic contacts joined one to the under surface of said first zone and one to said common surface in contact with both second and third zones of said transistor, a first electrical conductor in contact with one of said pair of ohmic contacts for providing circuit connections thereto, and a second electrical conductor in contact with the other of said pair of ohmic contacts for providing circuit connections thereto.

9. A negative resistance transistor comprising a first zone of N-type semiconducting material, a second zone of P-type semiconducting material adjoining the upper surface of said first zone to form a transistor junction therebetween, a third zone of N-type semiconducting material atop the top of said second zone to form a transistor junction therewith and separated from said first zone only by a minute thickness of said second zone, said third zone and second zone having a substantially common upper surface, a pair of ohmic contacts connected one to the underside of said first zone and one to the upper side of said second zone in contact with said third zone and second zone, a first electrical conductor in contact with the ohmic contact connected to the underside of said first zone, and a second electrical conductor in contact with the other ohmic contact of said pair, said electrical conductors being adapted to receive a variable voltage maintaining said first zone at a positive potential relative to said second zone and third zone thereon.

References Cited by the Examiner

UNITED STATES PATENTS

| | | | |
|---|---|---|---|
| 2,742,383 | 4/1956 | Barnes | 317—235 |
| 2,757,323 | 7/1956 | Jordan et al. | 317—235 X |
| 2,778,980 | 1/1957 | Hall | 317—235 |
| 2,875,505 | 3/1959 | Pfann | 317—235 |
| 2,905,873 | 9/1959 | Ollendorf | 317—235 |
| 2,971,139 | 2/1961 | Noyce | 317—235 |
| 2,983,633 | 5/1961 | Bernardi et al. | 317—235 X |

JOHN W. HUCKERT, *Primary Examiner.*

SAMUEL BERNSTEIN, GEORGE N. WESTBY, DAVID J. GALVIN, *Examiners.*